(12) United States Patent
Kushitani et al.

(10) Patent No.: US 7,183,878 B2
(45) Date of Patent: Feb. 27, 2007

(54) SURFACE ACOUSTIC WAVE FILTER

(75) Inventors: Hiroshi Kushitani, Izumisano (JP); Shinobu Nakaya, Neyagawa (JP); Takeo Yasuho, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 98 days.

(21) Appl. No.: 10/526,919

(22) PCT Filed: Aug. 20, 2004

(86) PCT No.: PCT/JP2004/012324

§ 371 (c)(1),
(2), (4) Date: Mar. 8, 2005

(87) PCT Pub. No.: WO2005/020436

PCT Pub. Date: Mar. 3, 2005

(65) Prior Publication Data

US 2006/0164182 A1    Jul. 27, 2006

(30) Foreign Application Priority Data

Aug. 25, 2003 (JP) .............................. 2003-299585

(51) Int. Cl.
*H03H 9/72* (2006.01)
*H03H 9/64* (2006.01)

(52) U.S. Cl. ........................ 333/133; 333/193

(58) Field of Classification Search .................. 333/133
See application file for complete search history.

(56) References Cited

U.S. PATENT DOCUMENTS

| | | | |
|---|---|---|---|
| 5,202,652 A * | 4/1993 | Tabuchi et al. ............. | 333/193 |
| 5,515,015 A | 5/1996 | Nakata ........................ | 333/132 |
| 5,554,960 A * | 9/1996 | Ohnuki et al. .............. | 333/132 |
| 6,750,737 B2 * | 6/2004 | Uriu et al. ................... | 333/133 |
| 6,822,537 B1 * | 11/2004 | Taniguchi et al. .......... | 333/194 |
| 6,985,712 B2 * | 1/2006 | Yamakawa et al. ......... | 455/333 |
| 2003/0058066 A1 | 3/2003 | Taniguchi et al. .......... | 333/193 |
| 2004/0127182 A1 * | 7/2004 | Hayashi .................... | 455/193.1 |
| 2005/0116790 A1 * | 6/2005 | Hongo et al. ................ | 333/133 |
| 2005/0206477 A1 * | 9/2005 | Cheema et al. ............. | 333/133 |

FOREIGN PATENT DOCUMENTS

| | | |
|---|---|---|
| JP | 7-106811 | 4/1995 |
| JP | 10-313229 | 11/1998 |
| JP | 2002-231849 | * 8/2002 |

OTHER PUBLICATIONS

G. Ponchak et al., The Use of Metal Filled Via Holes for Improving Isolation in LTCC RF and Wireless Multichip Packages, IEEE Transactions on Advanced Packaging, vol. 23, No. 1, Feb. 2000, pp. 88-99.

* cited by examiner

*Primary Examiner*—Barbara Summons
(74) *Attorney, Agent, or Firm*—Wenderoth, Lind & Ponack, L.L.P.

(57) ABSTRACT

A surface acoustic wave filter having a plurality of the transmission lines, each with one end connected to the surface acoustic wave element and the other end thereof connected to a ground. The transmission lines are divided by an additional transmission line which has multiple connections to a ground electrode at an interval equal to or lower than a wavelength of a using frequency. This structure provides grounds among a plurality of transmission lines and thus isolation among terminals can be increased to improve the filter characteristic.

13 Claims, 11 Drawing Sheets

FIG. 14 – PRIOR ART
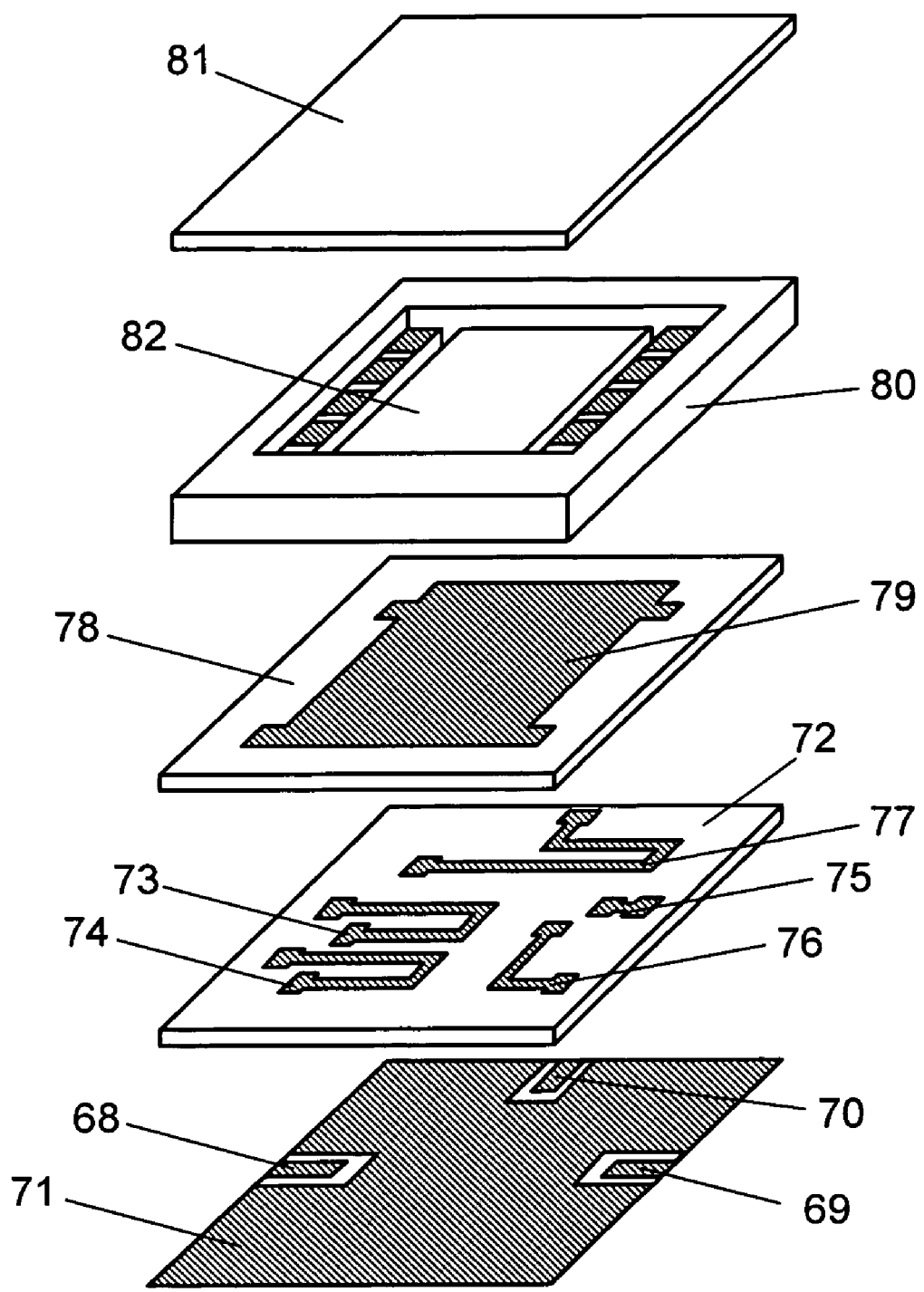

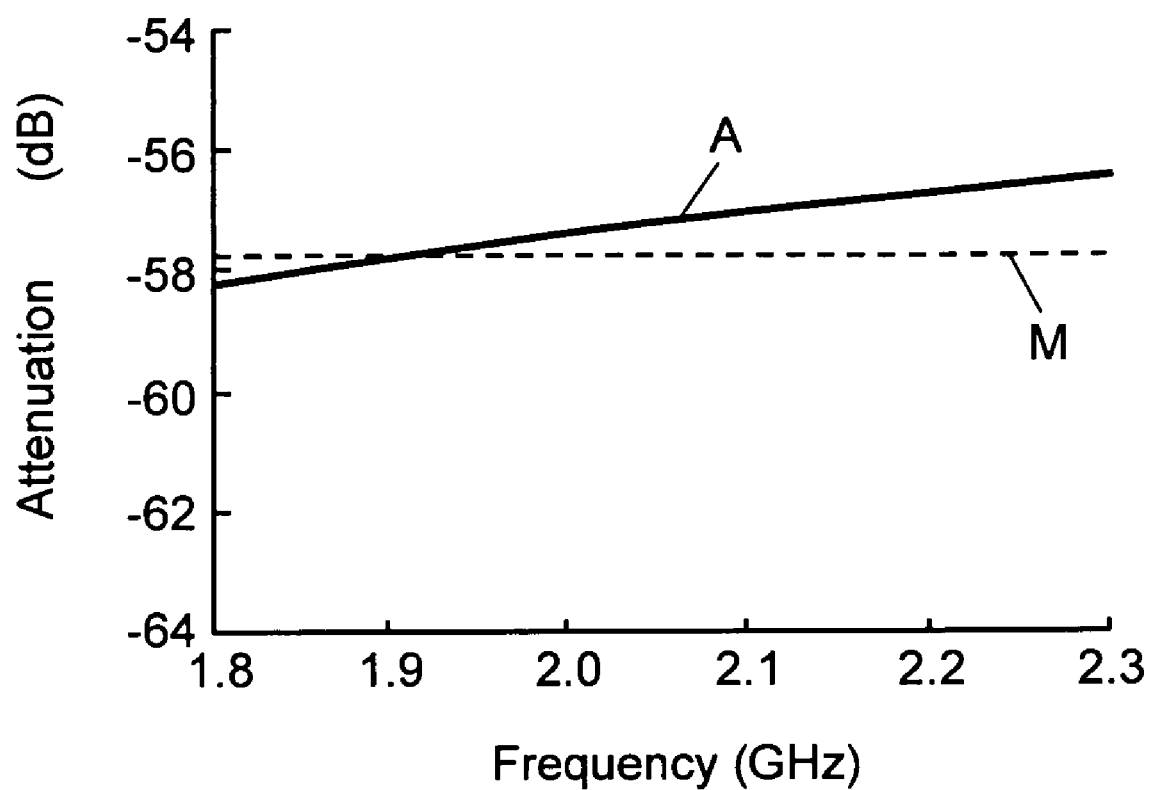
FIG. 15 – PRIOR ART

SURFACE ACOUSTIC WAVE FILTER

This application is a U.S. National phase application PCT International Application PCT/JP04/012324.

TECHNICAL FIELD

The present invention relates to a surface acoustic wave filter used for various communication devices.

PRIOR ART

A conventional surface acoustic wave filter (hereinafter referred to as SAW filter) will be described with reference to FIG. 14. The conventional SAW filter has: first dielectric layer 72, second dielectric layer 78, cavity 80, and metal plate 81. First dielectric layer 72 has, at the lower face thereof, transmission terminal 68, reception terminal 69, antenna terminal 70, and first ground electrode 71 and has, at the upper face thereof, transmission lines 73, 74, 75, 76, and 77. Second dielectric layer 78, provided so as to be opposed to transmission lines 73, 74, 75, 76, and 77, has at the upper face thereof second ground electrode 79. Cavity member 80 is provided so as to be opposed to second ground electrode 79 and has at the center thereof an opening section to provide a hollow shape. The upper side of cavity member 80 has metal plate 81 welded thereto to close the opening section of cavity member 80, thereby providing a package. Surface acoustic wave element 82 is mounted at the upper face of second ground electrode 79. This surface acoustic wave element 82 is provided so as not to have contact with cavity member 80 and metal plate 81. With regards to the conventional SAW filter having the structure as described above, the passage characteristic between transmission terminal 68 and antenna terminal 70 only with respect to the package (i.e., isolation characteristic) except for surface acoustic wave element 82 is shown by line A in FIG. 15. As can be seen from line A, the attenuation at 2.17 GHz is 56.8 dB.

Broken line M in FIG. 15 shows the frequency characteristic of the conventional SAW filter as described above when the SAW filter has a circuit as shown in FIG. 6 and has the frequency characteristic as shown in FIG. 7. As can be seen from FIG. 15, the SAW filter has attenuation in the frequency band from 2.11 GHz to 2.17 GHz of 57.8 dB, which is larger than the attenuation of the package (56.8 dB). Thus, a larger amount of signal propagates between transmission terminal 68 and antenna terminal 70

As described above, the conventional package had an insufficient isolation characteristic in order to provide a SAW filter having a large attenuation.

SUMMARY OF THE INVENTION

The surface acoustic wave filter of the present invention has at least one transmission line whose one end is connected to a surface acoustic wave element and the other end is connected to ground, and the transmission lines are divided by a transmission line which is connected to a ground electrode at an interval equal to or lower than a wavelength of a using frequency. This structure can increase the isolation among terminals and thus the filter characteristic can be improved.

The surface acoustic wave filter of the present invention also has a structure in which a transmission terminal, a reception terminal and an antenna terminal are divided by a transmission line connected to a ground at an interval equal to or lower than a wavelength of a using frequency. This structure can increase the isolation among terminals including the transmission terminal, the reception terminal and the antenna terminal.

BRIEF DESCRIPTION OF THE DRAWINGS

FIG. 14 is an exploded perspective view illustrating a conventional example.

FIG. 15 is a frequency characteristic diagram of a package part of the conventional example.

DETAILED DESCRIPTION OF THE INVENTION

Figure 1:
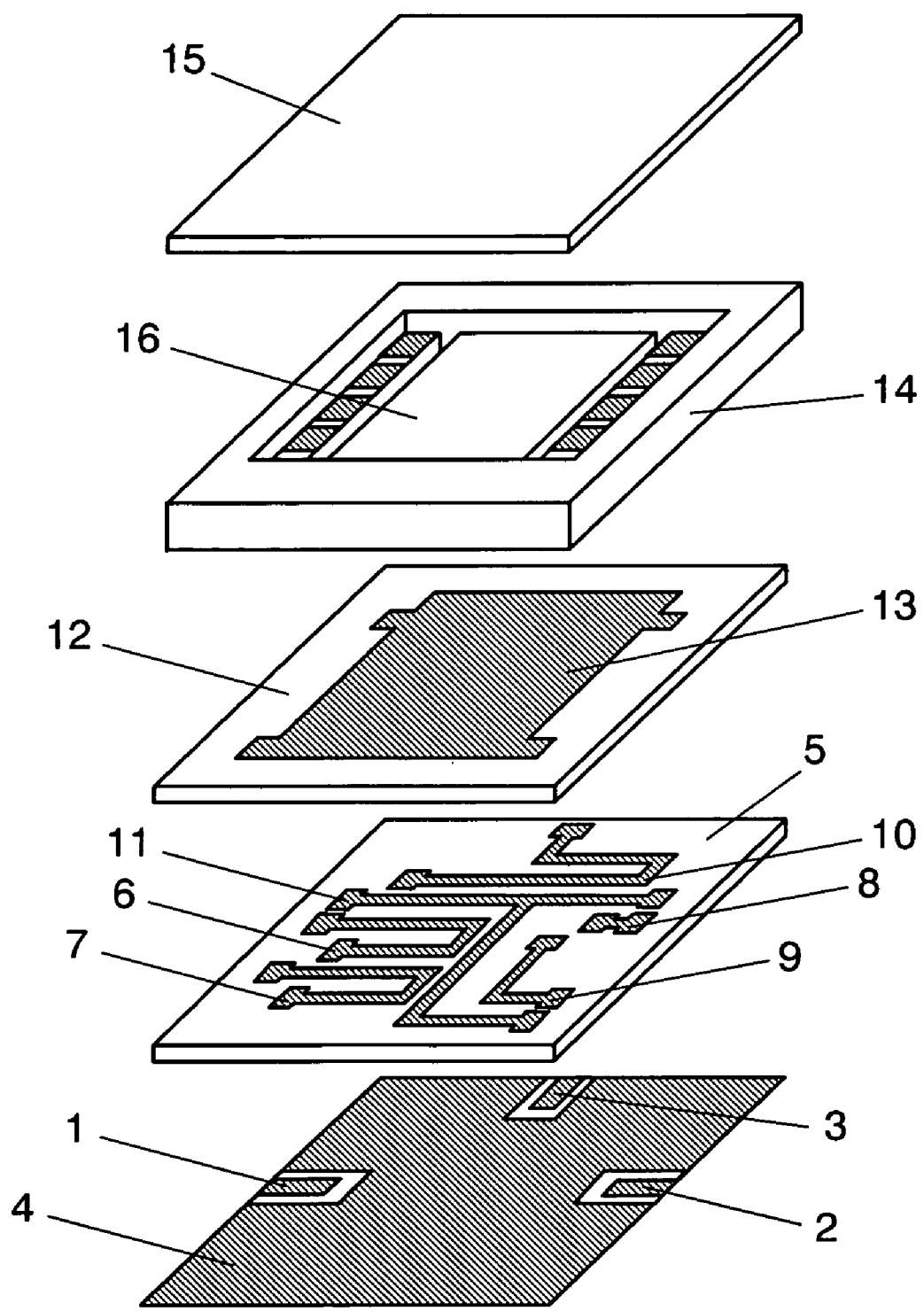
FIG. 1 is an exploded perspective view illustrating a SAW filter of a first embodiment of the present invention.

In a surface acoustic wave filter of the present invention (hereinafter referred to as a SAW filter), grounds are provided among a plurality of transmission lines of which one end is connected to a surface acoustic wave element and the other end is connected to a ground. As a result, isolation between terminals can be increased to improve the filter characteristic.

The SAW filter of the present invention also provides a ladder type filter in which SAW resonators connected serially and SAW resonators connected in parallel are connected in a ladder-like manner and can increase the freedom in the design of the SAW filter.

In the SAW filter of the present invention, at least one dielectric layer has thereon a transmission line that can be provided to have a multi-layer structure, thus increasing the freedom in the design of the transmission line.

Also in the SAW filter of the present invention, a connection via hole has a diameter that is smaller than the width of the transmission line to be connected. Thus, a land electrode for connecting the transmission line with a connection via hole is not required and thus the freedom in the design of the transmission line can be increased. The term "connection via hole" used herein refers to a via hole having an inner side provided with plating or a via hole filled with a conductive material that is used for interlayer connection in a laminated structure.

Also in the SAW filter of the present invention, the surface acoustic wave element is covered by a metal plate so that the surface acoustic wave element is sealed in an air-tight manner and thus the filter can have increased reliability.

Also in the SAW filter of the present invention, a layer having a transmission line is sandwiched by ground layers and the respective ground layers are connected by a connection via hole. This structure can strengthen the ground and thus a further increased isolation can be obtained.

Also in the SAW filter of the present invention, a transmission line connected to a ground at an interval equal to or lower than a wavelength of a using frequency has at least one branch. Thus, a transmission line connected to a ground at an interval equal to or lower than a wavelength of a using frequency can divide three or more regions. Thus, the number of pairs of terminals for improving the isolation can be increased.

Also in the SAW filter of the present invention, a transmission line connected to a ground at an interval equal to or lower than a wavelength of a using frequency has one or more corner sections. Each corner section preferably has an angle of 45° or 90°. This structure allows easy introduction of screen printing for providing a transmission line and thus the width of the path can be easily reduced.

By connecting the above corner section via the connection via hole to the ground electrode, a part having an angle can be grounded. A part having an angle in the transmission line has impedance different from that of a straight part, and thus the former and the latter have different coupling conditions. The structure as described above allows the part having the angle to have the same coupling conditions as those for the straight part.

Also in the SAW filter of the present invention, a transmission terminal, a reception terminal and an antenna terminal are divided by a transmission line connected to a ground at an interval equal to or lower than a wavelength of a using frequency. Thus, isolations among the respective transmission terminal, reception terminal, and antenna terminal can be increased.

Hereinafter, one embodiment of the present invention will be specifically described with reference to the drawings.

As shown in FIG. 1, a SAW filter in one embodiment has: first dielectric layer 5, second dielectric layer 12, cavity 14, and metal plate 15. First dielectric layer 5 has, at the lower face, transmission terminal 1, reception terminal 2, antenna terminal 3, and first ground electrode 4 and has, at the upper face, transmission lines 6, 7, 8, 9, 10, and 11. Second dielectric layer 12 provided to be opposed to transmission lines 6, 7, 8, 9, 10, and 11 has, at the upper face, second ground electrode 13. Cavity member 14 is provided so as to be opposed to second ground electrode 13 and has at the center an opening section to provide a hollow shape. The upper side of cavity member 14 has metal plate 15 welded thereto to close the opening section of cavity member 14, thereby providing a package.

Second ground electrode 13 has, at the upper face thereof, surface acoustic wave element 16. Surface acoustic wave element 16 is provided so as not to have contact with cavity member 14 and metal plate 15.

Figure 2A:
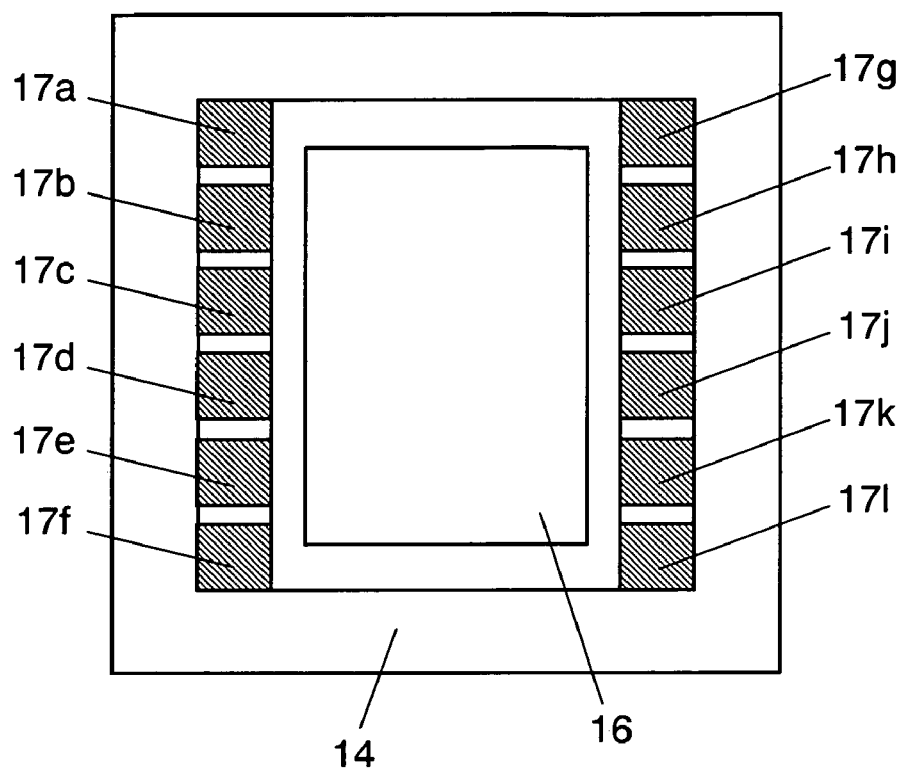
FIG. 2A is a top view illustrating a SAW filter of the first embodiment of the present invention.
Figure 2B:
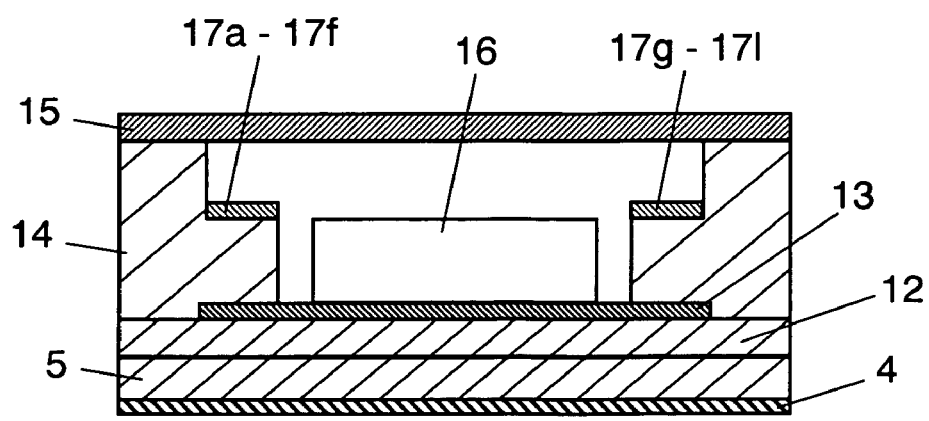
FIG. 2B is a cross-sectional view illustrating the SAW filter of the first embodiment of the present invention.

As shown in FIG. 2A, cavity member 14 has a structure surrounding surface acoustic wave element 16 provided at the center opening section. Surface acoustic wave element 16 is sandwiched by electrode pads 17a to 17l. As shown in the cross-sectional view of FIG. 2B, two sides of the inner periphery of cavity member 14 have stepped shapes. Electrode pads 17a, 17b, 17c, 17d, 17e, and 17f are formed on a step of one side, and electrode pads 17g, 17h, 17i, 17j, 17k, and 17l are formed on a step of the other side.

Figure 3:
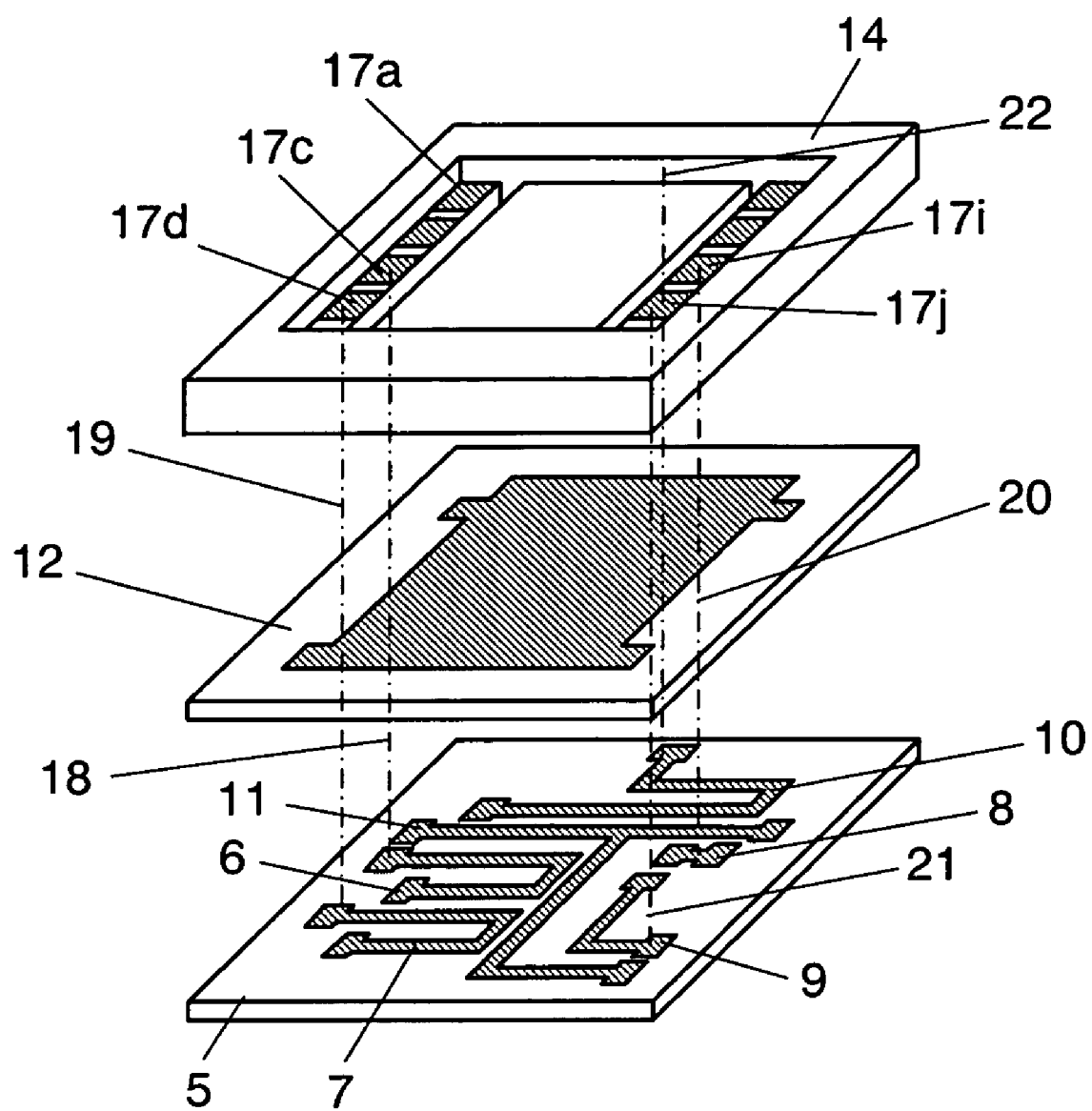
FIG. 3 is a magnified view illustrating a connection via hole part of the SAW filter of the first embodiment of the present invention.
Figure 4:
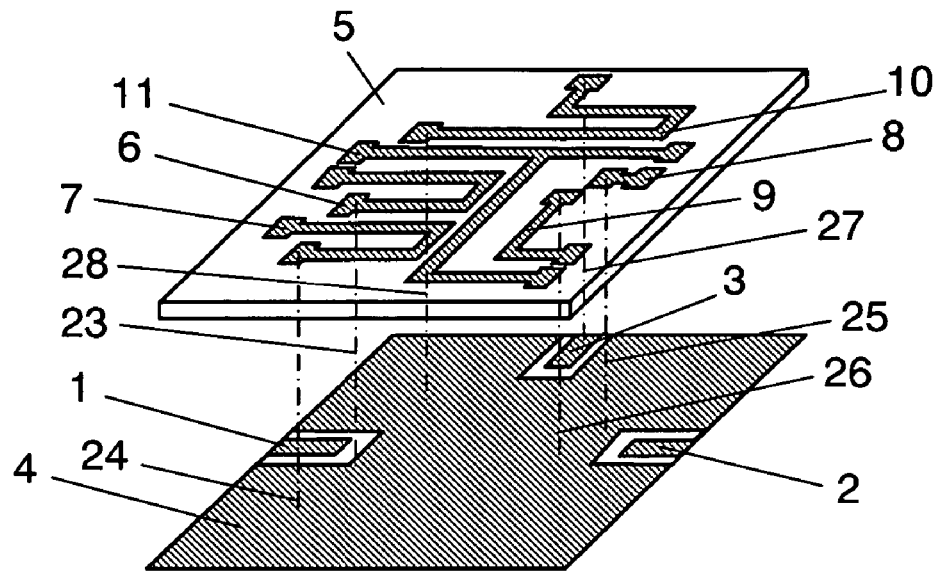
FIG. 4 is a magnified view illustrating a connection via hole part of the SAW filter of the first embodiment of the present invention.

FIG. 3 is a magnified view of the neighborhood of first dielectric layer 5, second dielectric layer 12, and cavity member 14 in FIG. 1. FIG. 4 is a magnified view of the neighborhood of first ground electrode 4 and first dielectric layer 5 in FIG. 1. One end of transmission line 6 is connected to electrode pad 17c through connection via hole 18 as shown in FIG. 3, and the other end thereof is connected to first ground electrode 4 through connection via hole 23 as shown in FIG. 4. Similarly, one end of transmission line 7 is connected to electrode pad 17d through connection via hole 19 and the other end thereof is connected to first ground electrode 4 through connection via hole 24. One end of transmission line 8 is connected to electrode pad 17i through connection via hole 20, and the other end is connected to first ground electrode 4 through connection via hole 25. One end of transmission line 9 is connected to electrode pad 17j through connection via hole 21, and the other end is connected to first ground electrode 4 through connection via hole 26. One end of transmission line 10 is connected to electrode pad 17a through connection via hole 22 and a transmission line (not shown) provided in cavity member 14 and the one end is also connected to antenna terminal 3 by connection vial hole 27, and the other end thereof is connected to first ground electrode 4 through connection via hole 28. As shown in FIG. 4, connection via hole 27 is a via hole extending from antenna terminal 3 in a vertical direction.

Figure 5:
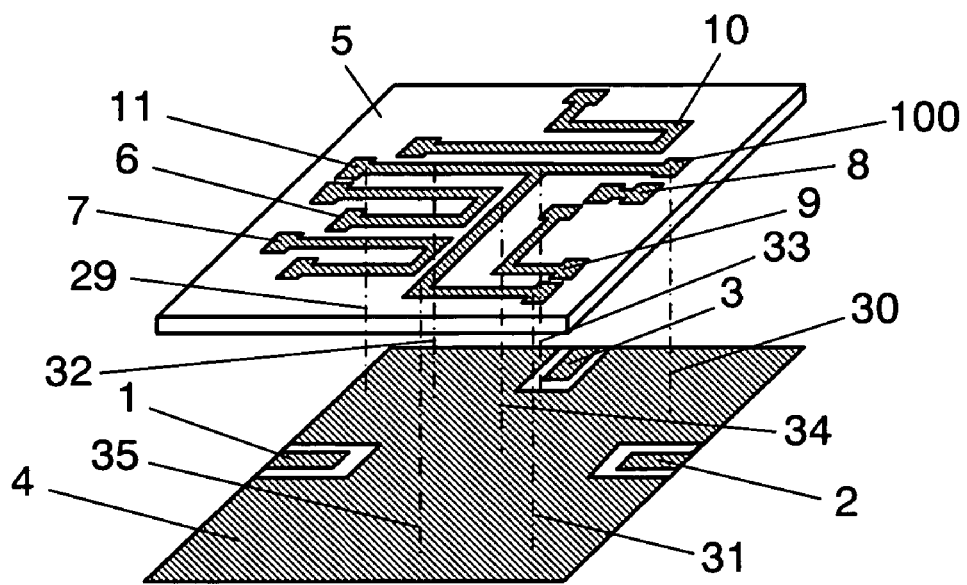
FIG. 5 is a magnified view illustrating a connection via hole part of the SAW filter of the first embodiment of the present invention.

FIG. 5 is a magnified view illustrating the neighborhood of first ground electrode 4 and first dielectric layer 5 of FIG. 1. The most important feature of the above structure is that the upper face of first dielectric layer 5 has transmission line 11. This transmission line 11 has a shape that has one branching point and three end sections. The three end sections are connected to first ground electrode 4 through connection via holes 29, 30, and 31. Transmission line 11 is also connected, between the end sections, to first ground electrode 4 through connection via holes 32, 33, 34, and 35. This allows transmission line 11 to have multiple connections to first ground electrode 4 at an interval equal to or lower than the wavelength of a using frequency. Connection via hole 33 is connected to the branching point of transmission line 11 and connection via hole 35 is connected to a point at which transmission line 11 is bent at a right angle.

Figure 6:
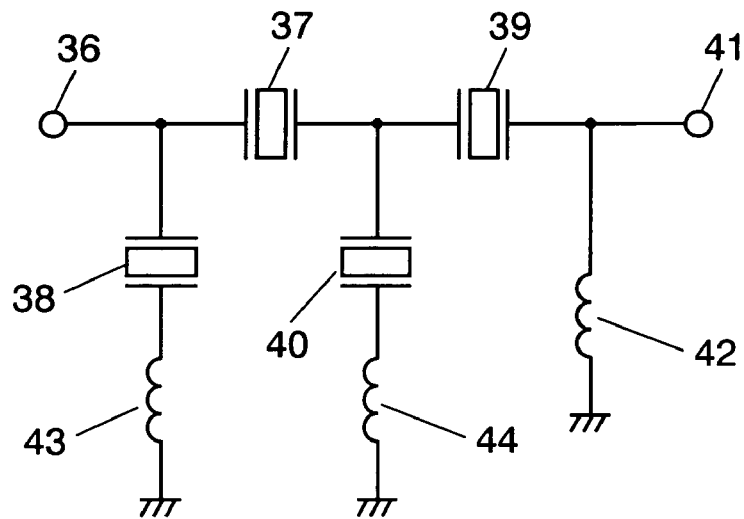
FIG. 6 is a circuit diagram of the SAW filter of the first embodiment of the present invention.

Next, the operation of the SAW filter of this embodiment will be described. A case utilizing a circuit shown in FIG. 6 will be described in detail as an example.

The following section will describe the circuit structure. The surface acoustic wave element 16 has at the surface thereof input terminal 36. This input terminal 36 is connected with one end of first serial connected SAW resonator 37 and one end of first parallel connected resonator 38. The other end of first serial connected SAW resonator 37 is connected with one end of second serial connected SAW resonator 39 and one end of second parallel connected SAW resonator 40. The other end of second serial connected SAW resonator 39 is connected with output terminal 41 provided at the surface of surface acoustic wave element 16.

Input terminal 36 is electrically connected to electrode pad 17e shown in FIG. 2A. Electrode pad 17e is connected to transmission terminal 1 and output terminal 41 is connected to electrode pad 17a. The other end of first parallel connected SAW resonator 38 is connected to electrode pad 17c. The other end of second parallel connected SAW resonator 40 is connected to electrode pad 17d. First inductor 42 in FIG. 6 corresponds to transmission line 10 of FIG. 1. Second inductor 43 corresponds to transmission line 6 and thus the other end of first parallel connected SAW resonator 38 is grounded to first ground 4 from electrode pad 17c through connection via hole 23. Third inductor 44 corresponds to transmission line 7 and thus the other end of second parallel connected SAW resonator 40 is grounded to first ground 4 from electrode pad 17d through connection via hole 24.

The structure as described above allows input terminal 36 and output terminal 41 to have therebetween the serial connection of first serial connected SAW resonator 37 and second serial connected resonator 40 and the parallel connection of first parallel connected SAW resonator 38 and second parallel connected resonator 40. As a result, the SAW filter of this embodiment provides a ladder-type filter in which two SAW resonators having serial connection and two SAW resonators having parallel connection are connected in a ladder-like manner.

Figure 7:
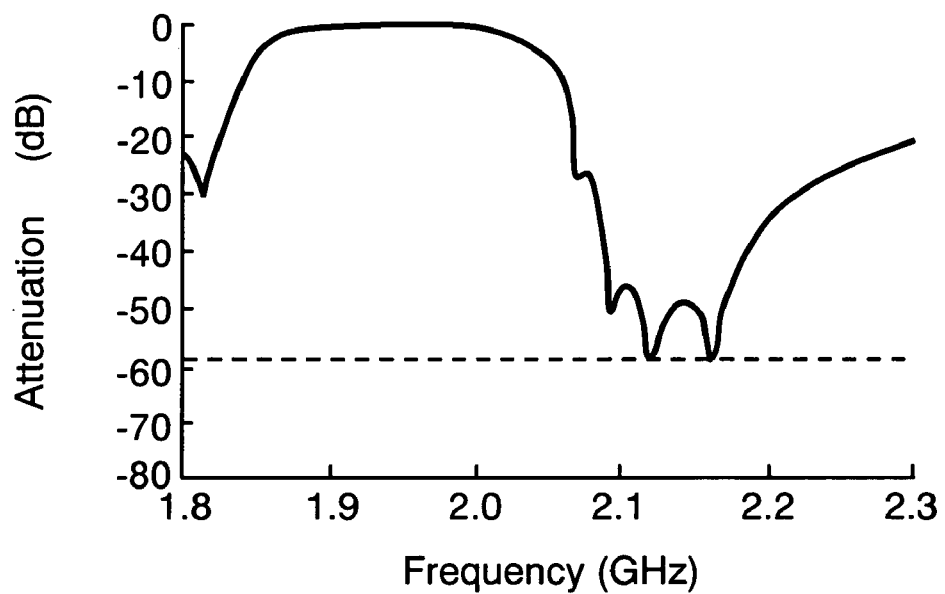
FIG. 7 is a frequency characteristic diagram of the SAW filter of the first embodiment of the present invention.

With regards to the SAW filter having the structure as described above, the frequency characteristic between transmission terminal 1 and antenna terminal 3 is shown in FIG. 7. A range from 1.92 GHz to 1.98 GHz shows a passage characteristic having a small loss and both sides thereof show a characteristic showing an attenuation. The most remarkable characteristic is that a frequency band from 2.11 GHz to 2.17 GHz shows a large attenuation. The reason why such a large attenuation can be obtained will be described with reference to FIG. 8.

Figure 8:
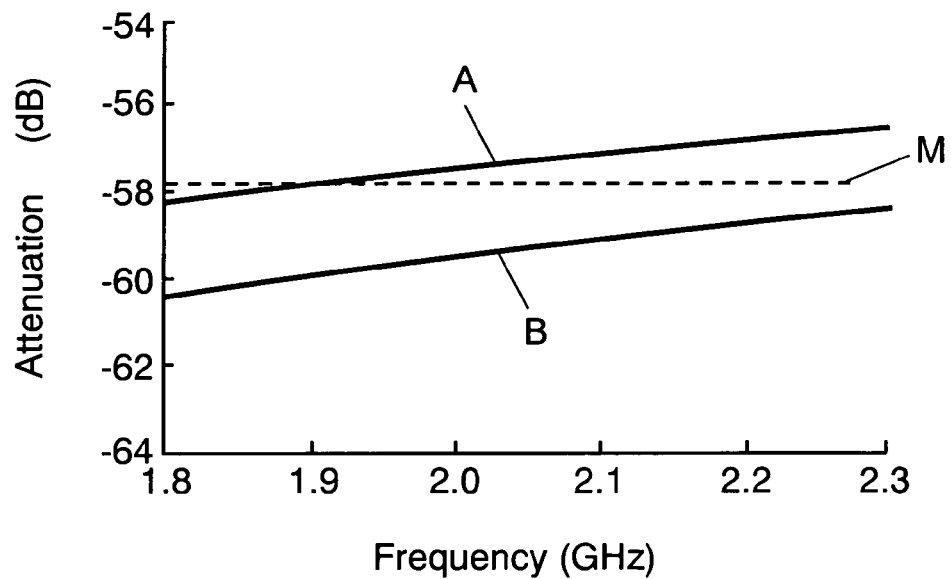
FIG. 8 is a frequency characteristic diagram of the SAW filter package part of the first embodiment of the present invention.

Line B of FIG. 8 shows the frequency characteristic between transmission terminal 1 and antenna terminal 3 in the case of only the SAW filter package of this embodiment (i.e., isolation characteristic when surface acoustic wave element 16 is removed in this embodiment). On the other hand, line A shows the isolation characteristic of the conventional package as shown in FIG. 15.

As described with reference to FIG. 1, transmission line 6 and transmission line 10 are provided on first dielectric layer 5 and the electric field coupling between them is maximum when the former and the latter are provided to have the minimum distance therebetween. Transmission line 11 is provided on dielectric layer 5 so as to separate transmission line 6 from transmission line 10. Since transmission line 11 is connected to first ground electrode 4 through connection via holes 29, 30, 31, 32, 33, 34, and 35 as shown in FIG. 5, transmission line 11 has a potential that is sufficiently low. Thus, transmission line 11 provides an effect for reducing the electric field coupling between transmission line 6 and transmission line 10. As a result, isolation between transmission terminal 1 and antenna terminal 3 can be increased.

First dielectric layer 5, second dielectric layer 12, and cavity member 14 are prepared by low-temperature co-fired ceramics having alumina as a main element and having a dielectric constant of 7.8 to provide a package having a shape of 3.8 mm×3.8 mm×1.3 mm. Transmission line 6, transmission line 7, transmission line 10, and transmission line 11 are formed by a conductor including silver as a main element to have a line width of 100 μm. Transmission line 6 and transmission line 10 are formed to have the minimum distance therebetween of 200 μm. Transmission line 11 is provided at a position at which transmission line 6 and transmission line 10 have the minimum distance therebetween and is formed so as to separate transmission line 6 from transmission line 10 while including the center part located between transmission line 6 and transmission line 10. Each connection via hole is formed by a conductor including silver as a main element to have a diameter of 100 μm. A part of each transmission line at which each connection via hole is connected is formed to have a line width of 200 μm.

Transmission line 11 is connected through connection via holes 29 to 35 to ground electrode 4 at intervals equal to or lower than a wavelength of 2.17 GHz. This allows the impedance among the connection via holes to be small when compared to a using frequency and reduces the impedance in transmission line 11 to a negligible level.

When the electric field coupling between transmission terminal 1 and antenna terminal 3 of the package having the structure as described above is represented as a capacitor, the electric field coupling is about 0.00095 pF at 2.17 GHz, which is about 20% lower when compared to 0.0012 pF in the conventional example. The frequency characteristic of the attenuation is shown by line B of FIG. 8. As can be seen from line B, the attenuation at 2.17 GHz is 58.8 dB. This value exceeds even 57.8 dB that is the maximum attenuation of the SAW filter shown by broken line M in FIG. 7 and FIG. 8. Therefore, signals propagating from transmission terminal 1 via the package to antenna terminal 3 in a band from 2.11 GHz to 2.17 GHz is smaller than signals propagating from transmission terminal 1 via surface acoustic wave element 16 to antenna terminal 3. As a result, the package having this structure can provide the SAW filter having the characteristic shown in FIG. 7.

Surface acoustic wave element 16 of this embodiment is preferably prepared by lithium tantalate because an angle at which the element is cut has an increased freedom to provide a filter having a lower loss in an easy manner. An angle at which surface acoustic wave element 16 of this embodiment is cut is 39°.

In the above embodiment, transmission lines 11 at parts in which transmission line 11 is connected to connection via holes 29, 30, and 31 have an increased line width to provide land electrodes 100. Consequently, the transmission line at the connection part is provided with a width that is larger than the diameter of the connection via hole. Alternatively, the diameter of the connection via hole may be provided to be smaller than the line width of transmission line 11. In this case, it is not necessary for transmission line 11 to have land electrode 100 for the connection to connection via holes 29 to 35 and thus transmission line 11 can have an increased freedom in the design.

Although transmission line 11 in the above embodiment is bent at a right angle at one point, transmission line 11 also may be bent at an angle of 45°. In the latter case, a screen printing for providing transmission line 11 can be performed in a manner in which the path width is controlled easily and thus the line width can be further reduced and the SAW filter can have a smaller size without having any small influence on the characteristic even when a fine line needs to be formed.

Figure 9:
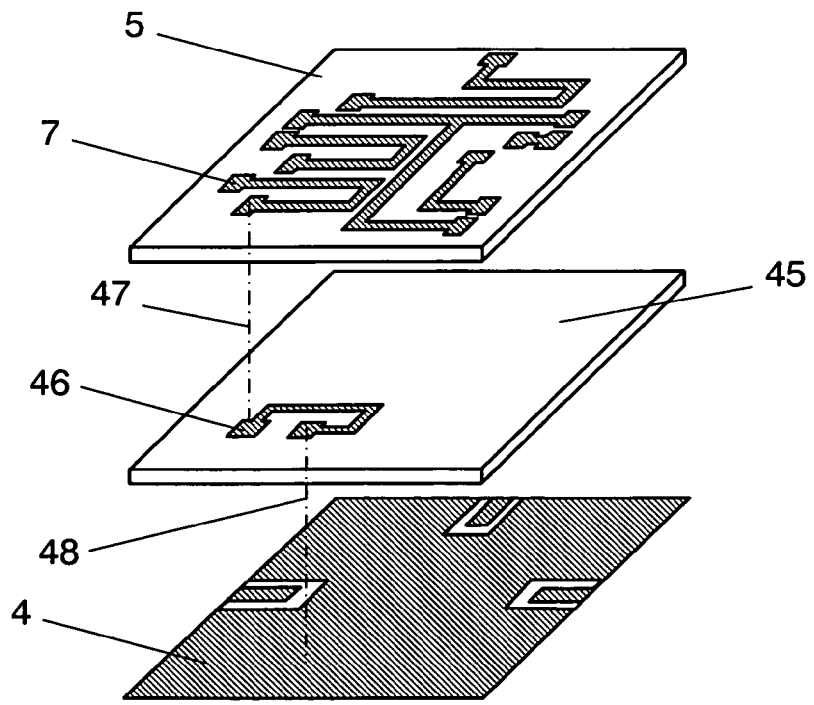
FIG. 9 is a magnified view illustrating a connection via hole part of a second embodiment of the present invention.

Although transmission line 11 in the above embodiment is provided on first dielectric layer 5, one transmission line may be divided into a plurality of layers. FIG. 9 shows an example in which third dielectric layer 45 is inserted between first ground electrode 4 and first dielectric layer 5. FIG. 9 illustrates a structure in which third dielectric layer 45 has thereon transmission line 46, one end of transmission line 46 is connected to the other end of transmission line 7 through connection via hole 47, and the other end of transmission line 46 is connected to first ground electrode 4 through connection via hole 48. The structure as described above provides an increased freedom in the design of a transmission line to be formed. Specifically, the transmission line can have an increased inductance component that can be used for the design of the filter in an easier manner.

Figure 10:
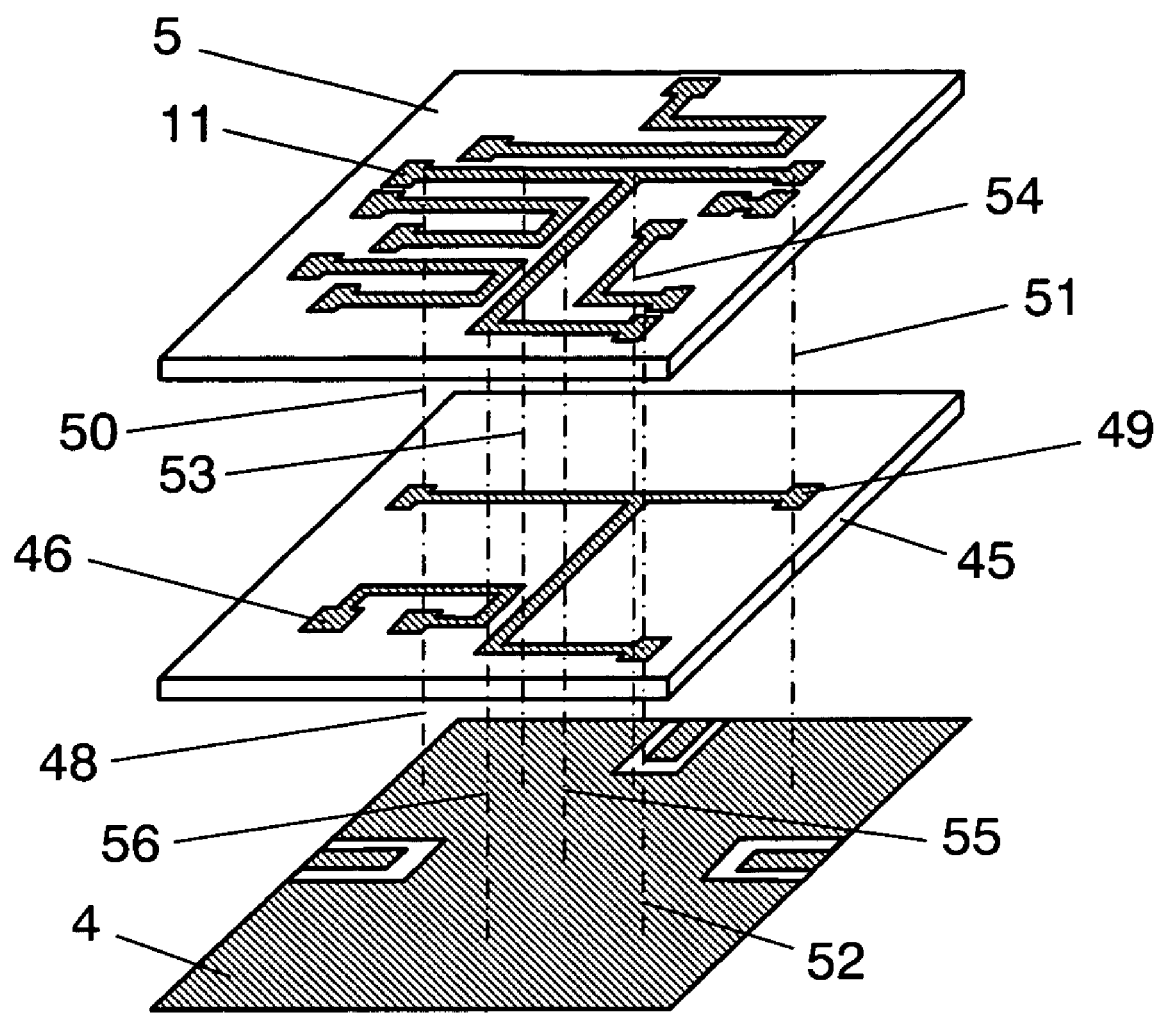
FIG. 10 is a magnified view illustrating a connection via hole part of a third embodiment of the present invention.

When there are two or more transmission lines to be divided to have a plurality of layers as described above, third dielectric layer 45 may have thereon transmission line 49, and transmission line 49 is connected to transmission line 11 and first ground electrode 4 through connection via holes 50, 51, 52, 53, 54, 55, and 56, as shown in FIG. 10. This structure can prevent the deterioration of the isolation.

Figure 11:
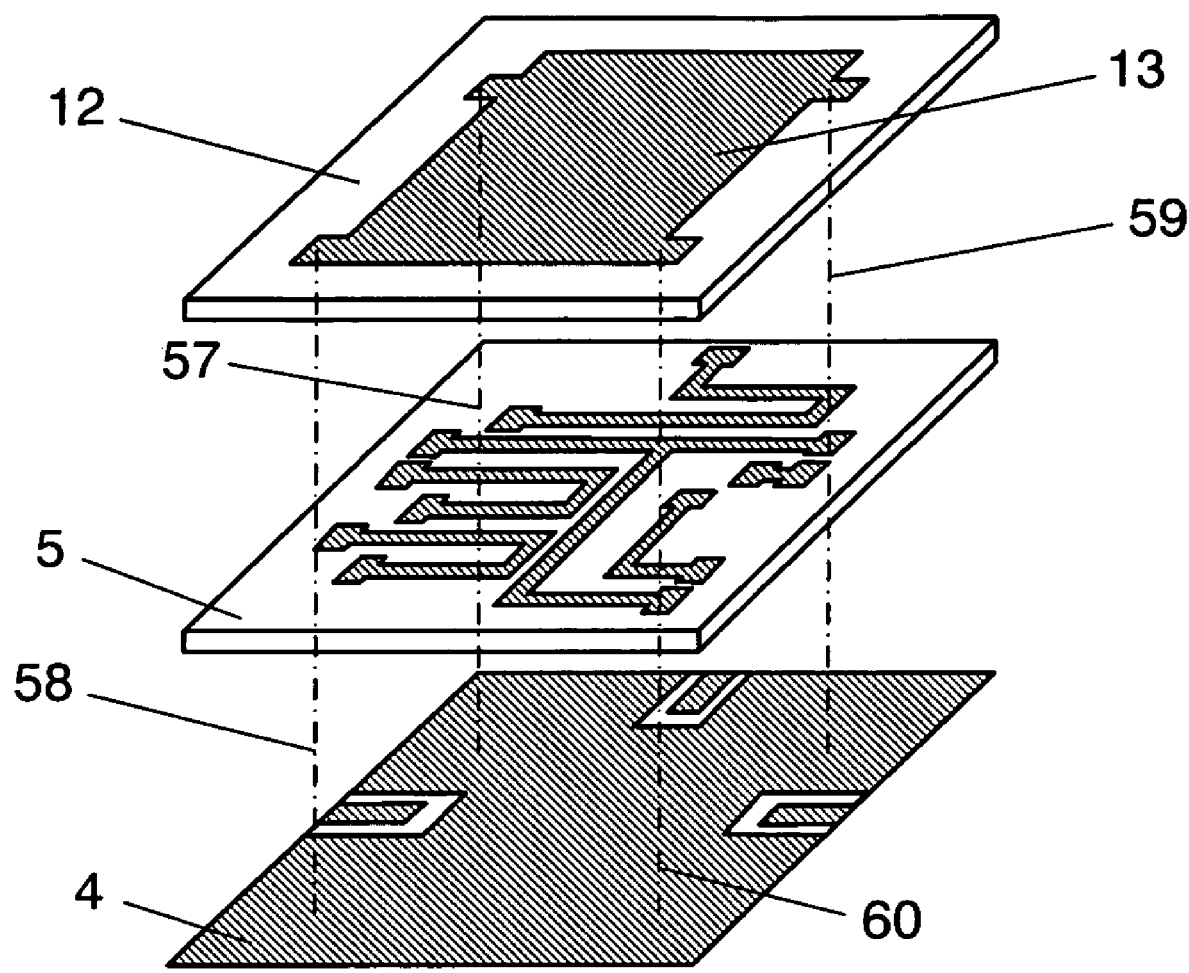
FIG. 11 is a magnified view illustrating a connection via hole part of a fourth embodiment of the present invention.

Although first ground electrode 4 is not connected to second ground electrode 13 in the above embodiment, the former and the latter may be connected to each other through connection via holes 57, 58, 59, and 60 as shown in FIG. 11. The connection between the former and the latter to strengthen the ground can provide a further increased isolation.

Figure 12:
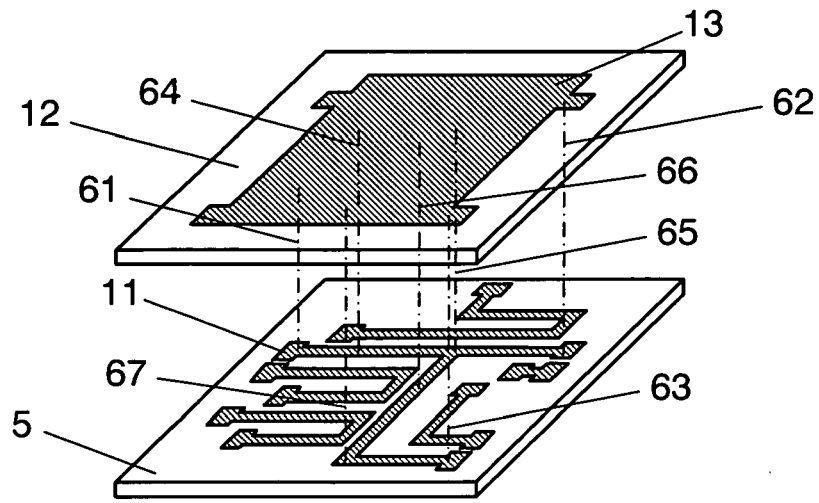
FIG. 12 is a magnified view illustrating a connection via hole part of a fifth embodiment of the present invention.
Figure 13:
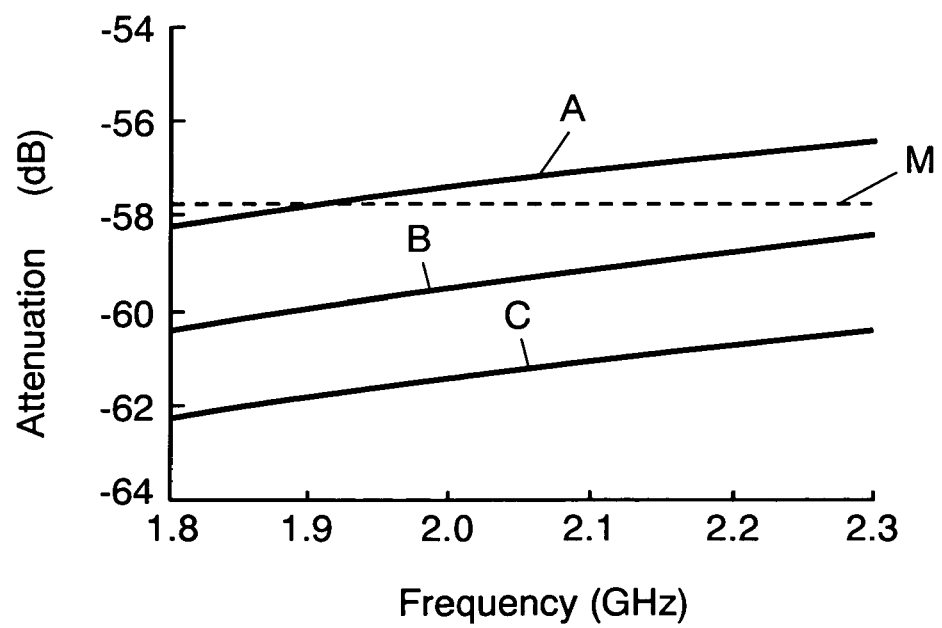
FIG. 13 is a frequency characteristic diagram of a package part of the fifth embodiment of the present invention.

The above embodiment is an example in which transmission line 11 shown in FIG. 5 is connected to first ground electrode 4 through connection via holes 29, 30, 31, 32, 33, 34, and 35. However, another structure may also be provided as shown in FIG. 12 in which transmission line 11 is connected to second ground electrode 13 through connection via holes 61, 62, 63, 64, 65, 66, and 67. This structure provides an effect for further reducing the electric field coupling between transmission line 6 and transmission line 10. When the electric field coupling between transmission terminal 1 and antenna terminal 3 of the package having the structure as described above is represented as a capacitor, the capacitance is about 0.00076 pF at 2.17 GHz, which is about 36% lower when compared to the conventional example. This is represented as an attenuation by line C of FIG. 13. The attenuation is 60.7 dB at 2.17 GHz, which shows a further increase of 1.9 dB.

The above embodiment includes a filter having a pass band of 60 MHz from 1.92 GHz to 1.98 GHz and an attenuation band of 60 MHz from 2.11 GHz to 2.17 GHz between transmission terminal 1 and antenna terminal 3. Also, another filter that has an attenuation band of 60 MHz from 1.92 GHz to 1.98 GHz and a pass band of 60 MHz from 2.11 GHz to 2.17 GHz can be additionally formed between reception terminal 2 and antenna terminal 3. In this case, transmission terminal 1, reception terminal 2, and antenna terminal 3 are divided by transmission line 11, thus providing an improvement in the isolation characteristic among the respective terminals. In any of the above cases, the pass band has a lower frequency than that of the attenuation band.

When an even wider band is required, a pass band or an attenuation band of 60 MHz or more and 1 GHz or less can be provided.

The SAW filter of the present invention provides a superior characteristic in a frequency band from 100 MHz to 5 GHz and is particularly suitable in use in a radio frequency band.

INDUSTRIAL APPLICABILITY

The SAW filter of the present invention is useful for providing a so-called duplexer for branching a transmission signal and a reception signal used for a radio frequency circuit in a mobile communication device (e.g., cellular phone). The SAW filter of the present invention is particularly useful for a duplexer used for a system using a CDMA method for example that has a wide pass band and an attenuation band suitable for recent data communication having a large amount of data.

The invention claimed is:

1. A surface acoustic wave filter comprising:
a first dielectric layer having a first ground on its lower face and a plurality of transmission lines on its upper face;
a second dielectric layer provided at the upper face of the first dielectric layer and having a second ground on its upper face;
a surface acoustic wave element provided at the upper face of the second dielectric layer; and
a cavity member provided at the upper face of the second dielectric layer and surrounding the surface acoustic wave element,
wherein:
one end of each of the plurality of transmission lines is connected to the surface acoustic wave element and the other end thereof is connected to the first or second ground;
the surface acoustic wave filter has an additional transmission line between two neighboring transmission lines among the plurality of transmission lines; and
the additional transmission line has multiple connections to the first or second ground at an interval equal to or lower than a wavelength of a using frequency.

2. A surface acoustic wave filter according to claim 1 wherein the surface acoustic wave element has at the surface thereof an input terminal, an output terminal, at least two serial connected resonators and at least two parallel connected resonators.

3. A surface acoustic wave filter according to claim 1, wherein the first dielectric layer includes multiple dielectric layers, and at least one of the plurality of transmission lines is disposed on each of the multiple dielectric layers.

4. A surface acoustic wave filter according to claim 1 further comprising a metal plate for covering the cavity member.

5. A surface acoustic wave filter according to claim 1 further comprising a connection via hole having therein a conductor, wherein the connection via hole connects the first ground to the second ground.

6. A surface acoustic wave filter according to claim 1 further comprising a connection via hole connected to one of the transmission lines, and the connection via hole has a diameter smaller than a line width of said one of the transmission lines.

7. A surface acoustic wave filter according to claim 1 wherein the additional transmission line has at least one branch.

8. A surface acoustic wave filter according to claim 1 wherein the additional transmission line has at least one corner section.

9. A surface acoustic wave filter according to claim 8 wherein a corner of the corner section has an angle of 45° or 90°.

10. A surface acoustic wave filter according to claim 8 wherein the additional transmission line at the corner section is connected via a connection via hole to the first or second ground.

11. A surface acoustic wave filter according to claim 1 further comprising a transmission terminal, a reception terminal, and an antenna terminal at the lower face of the first dielectric layer.

12. A surface acoustic wave filter according to claim 1 wherein at least one of a pass band and an attenuation band is 60 MHz or more.

13. A surface acoustic wave filter according to claim 1 wherein the additional transmission line suppresses an electric field coupling between the two neighboring transmission lines.

* * * * *